(12) United States Patent
Baeg et al.

(10) Patent No.: US 7,089,470 B1
(45) Date of Patent: Aug. 8, 2006

(54) PROGRAMMABLE TEST PATTERN AND CAPTURE MECHANISM FOR BOUNDARY SCAN

(75) Inventors: Sang Hyeon Baeg, Cupertino, CA (US); Sung Soo Chung, San Jose, CA (US); Hongshin Jun, San Jose, CA (US)

(73) Assignee: Cisco Technology, Inc., San Jose, CA (US)

(*) Notice: Subject to any disclaimer, the term of this patent is extended or adjusted under 35 U.S.C. 154(b) by 445 days.

(21) Appl. No.: 10/412,192

(22) Filed: Apr. 11, 2003

(51) Int. Cl.
*G01R 31/28* (2006.01)
*G06F 11/00* (2006.01)

(52) U.S. Cl. ........................................ 714/727; 714/738
(58) Field of Classification Search ..................... None
See application file for complete search history.

(56) References Cited

U.S. PATENT DOCUMENTS 6,122,762 A * 9/2000 Kim ............................ 714/726
6,430,718 B1 * 8/2002 Nayak ......................... 714/727
6,807,644 B1 * 10/2004 Reis et al. ................... 714/724

* cited by examiner

Primary Examiner—Christine T. Tu
(74) Attorney, Agent, or Firm—Thelen Reid & Priest LLP; Steven J. Robbins

(57) ABSTRACT

Programmable test pattern driver and capture mechanisms for boundary scan cluster or functional block testing. A boundary scan test system includes at least one device under test. The device may include a Test Access Port (TAP) controller, a plurality of output AC boundary scan cells (BSCs), and a plurality of input AC BSCs. The device may further include a programmable AC_Pattern_Source signal generator configured to produce AC signal patterns that selectively remain unchanged for at least one cycle before and after an original capture cycle location, a programmable AC_Sync signal generator configured to independently control the AC_Sync signal to lead or lag an original cycle location at full cycle increments, a programmable phase controller configured to independently control either the rising or falling edge aligned AC_Pattern_Clock signal or AC_Counter_Clock signal, and an AC_Test_Clock signal switcher configured to selectively utilize one of a plurality of clock signals including a TCK signal.

11 Claims, 13 Drawing Sheets

PROGRAMMABLE TEST PATTERN AND CAPTURE MECHANISM FOR BOUNDARY SCAN

FIELD OF THE INVENTION

The present invention relates generally to boundary scan testing of interconnections between integrated circuits. More specifically, the present invention relates to differential AC coupled boundary scan cluster or functional block testing.

BACKGROUND OF THE INVENTION

Electronic systems generally include at least one printed circuit board (PCB) containing one or more integrated circuit (IC) chips or ICs. ICs typically include input/output (I/O) pins which may be coupled to various interconnects of the PCB. Testing performance of electronic systems which include PCBs and ICs typically requires testing at multiple levels including at the chip level, at the board level, and at the system level. Testing at the board level includes testing interconnects of the PCB. Testing at the system level requires analysis of interconnections between and among the ICs, the PCBs, and other devices both on and off the PCB.

To enhance testability at the board level as well as at the system level, a common design practice at the chip level is to incorporate boundary scan test logic into an IC in accordance with IEEE Standard 1149.1. 1149.1 specifies the function of boundary scan logic known as JTAG, which is named for the Joint Test Action Group, for control of boundary scan testing. Two basic elements of an IC are a core logic and the I/O pins. In accordance with 1149.1, boundary scan cells (BSCs) are inserted between the core logic and the I/O pins of the IC. BSCs are typically inserted for all I/O pins of the plurality of ICs on the PCB and may be used to test the integrity of the interconnections between the plurality of ICs.

Each IC may be controlled by boundary scan logic, in accordance with 1149.1, to operate either in a system mode or in a JTAG test mode. In the system mode, system data signals relating to core functions of the IC are passed through the I/O pins to and from devices external to the IC. In the JTAG test mode, test data are provided by the boundary scan chain for the purpose of testing interconnections between the IC and devices external to the IC. The boundary scan test access port (TAP) controller also provides test control signals which include mode signals, shift signals, clock signals, and update signals, among others, each of which is well known. The mandated public instructions include a bypass instruction, a sample instruction, a preload instruction, and a extest instruction. The extest instruction controls BSCs to perform a boundary scan test among the various ICs.

The IC further includes a test data input (TDI) demultiplexer, a test data output (TDO) multiplexer, a test access port (TAP) controller, and a plurality of test registers such as a bypass register, an instruction register, and an identification register. The TDI demultiplexer includes an input coupled to receive a test data signal from the boundary scan logic which is typically driven externally to the IC. The TDI demultiplexer includes a first output coupled to a TDI input of a first BSC of the plurality of BSCs in the IC. Each of the BSCs includes a TDI input and a TDO output. Each of BSCs is connected serially from a TDO output to a TDI input to propagate test data signals from one BSC to the next BSC in the chain. The TDI demultiplexer further includes a second output coupled to an input of the core logic, a third output coupled to an input of the bypass register; a fourth output coupled to an input of the instruction register; and a fifth output coupled to an input of the identification register.

The TDO multiplexer includes an output which is coupled to provide a test data signal to another IC or to the boundary scan logic. The TDO multiplexer further includes: a first input coupled to a TDO output of a last BSC of the plurality of BSCs in the IC, a second input coupled to an output of the bypass register; a third input coupled to an output of the instruction register, and a fourth input coupled to an output of the identification register. The identification register includes inputs coupled to outputs of the TAP controller. The TAP controller includes inputs coupled to receive a TMS signal, a TCK signal, and a TRST signal from the boundary scan logic.

In general, there are three possible I/O structures for an IC including a two-state I/O structure, a three-state I/O structure, and a bi-directional I/O structure. Each of the three I/O structures provides coupling between the core logic and at least one I/O pin. Any or all of the I/O structures may be used in an IC depending on the particular circumstances. The two-state I/O structure includes a two-state output buffer having an input and an output. The input of the two-state output buffer is coupled to a system data output of the core logic. The output of the two-state output buffer is coupled to an I/O pin. The three-state I/O structure includes a three-state output buffer having an input, an output, and a control input. The input of the three-state output buffer is coupled to a system data output of the core logic. The output of the three-state output buffer is coupled to an I/O pin. The control input of the three-state output buffer is coupled to a three-state system control signal output line of the core logic. The bi-directional I/O structure includes a bi-directional buffer. The bi-directional buffer includes an output buffer element having an input, an output, and a control input and an input buffer element having an input and an output. The control input of the output buffer element is coupled to a bi-directional control signal output line of the core logic. The input of the output buffer element is coupled to a system data output of the core logic. The output of the input buffer element is coupled to a system data received input of the core logic. The output of the output buffer element and the input of the input buffer element are coupled together with an I/O pin.

According to conventional methods and apparatus for boundary scan testing, the BSCs are inserted into the I/O structures between the buffers and the core logic. For a two-state output structure, a BSC is inserted between the core logic and the input of the two-state output buffer. For a three-state output structure, a BSC is inserted between the system data output of the core logic and the input of the three-state output buffer. Also, a BSC is inserted between the three-state control signal output line of the core logic and the control input of the three-state output buffer. For a bi-directional output structure, a BSC is inserted between the system control signal output line of the core logic and the bi-directional output buffer. Also, a bi-directional BSC is inserted between the core logic and the bidirectional output buffer.

IEEE Standard 1149.1 was first adopted in 1990. It has been widely used and has proved to be very successful. 1149.1 has been amended twice to improve it. However, 1149.1 does not address all situations and design practices. One such practice is the inclusion of capacitive coupling in the interconnections between ICs. A capacitor is added either to the connection between the ICs or to one, the other, or both of the I/O pins of the ICs or the PCBs with connectors. The capacitor is designed to reduce noise and block unwanted common mode voltage differences in the interconnection. For discussion, this will be referred to alternatively as either being AC coupled or DC de-coupled.

Turning first to FIG. 1, a block diagram of ten possible combinations of DC and AC coupled interconnections between two devices is shown. The choice of which of the combinations shown that are actually used depends on the circumstances. Because of the capacitor, the value of a signal at the receiving end of the interconnection is no longer the same as the value at the driving end. This assumes that the steady state condition has been reached where all transient values of driven data have subsided. The square wave input signal is transformed at the receiving end into a series of decaying signal spikes corresponding to the transitions of the square wave. The rate of the spike decay depends on the value of the capacitor and the inherent resistance, that is, the RC constant. The result is that conventional 1149.1 testing becomes impractical on AC coupled interconnections. One will note that there are seven possible AC coupled combinations where 1149.1 will not work as compared to only three DC coupled combinations where 1149.1 will work. As the quest for higher signal speeds continues in the future, the use of AC coupling will increase. This becomes especially true with the development of optical communication signals. The consequence will be less and less reliance on conventional 1149.1 testing.

Beyond the direct connected AC coupled testing are the areas of AC coupled cluster testing and AC coupled functional block testing. Under certain circumstances, one might want to test a cluster or functional block of components. As these components might not be directly connected to one another, further testing difficulties might arise. For example, the components might have multiple AC coupled connections in series or they might have non-electrical connections. If so, the test signal propagation may require continuous streams of alternating patterns in order to maintain minimum cutoff frequency requirements of the signal path or to maintain prolonged test signal application to compensate for long signal delays. Delay is one of the difficulties that might be encountered and is a measure of the time that a signal takes to propagate from the transmitter to the receiver. Another way to express the delay of the signal is in terms of the latency of the communication path. Generally the delay is constant but initially unknown. Another potential difficulty is pin skew which is a measure of the variation of two or more signals that are designed to be simultaneous in theory but are not quite in practice. Generally the skew is constant but initially unknown. Yet another potential difficulty is jitter which is a measure of the variation of a signal over time, that is, a signal that is supposed to have uniform timing in theory is not quite in practice. Jitter can be especially problematic when it arises in one or more of the clock signals as a consistent clock signal can be important for accurate timing. Generally the jitter is within bounds that are not initially known. It is not strictly necessary that each of these three difficulties be precisely measured in order to compensate for them, but they should be accounted for to produce accurate testing results. A flexible approach is proposed.

BRIEF DESCRIPTION OF THE INVENTION

Programmable test pattern driver and capture mechanisms for boundary scan cluster or functional block testing is disclosed. A boundary scan test system includes at least one device under test. The device may include a Test Access Port (TAP) controller, a plurality of output AC boundary scan cells (BSCs), and a plurality of input AC BSCs. The device may further include a programmable AC_Pattern_Source signal generator configured to produce AC signal patterns that selectively remain unchanged for at least one cycle before and after an original capture cycle location, a programmable AC_Sync signal generator configured to independently control the AC_Sync signal to lead or lag an original cycle location at full cycle increments, a programmable phase controller configured to independently control either the rising or falling edge aligned AC_Pattern_Clock signal or AC_Counter_Clock signal, and an AC_Test_Clock signal switcher configured to selectively utilize one of a plurality of clock signals including a TCK signal.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
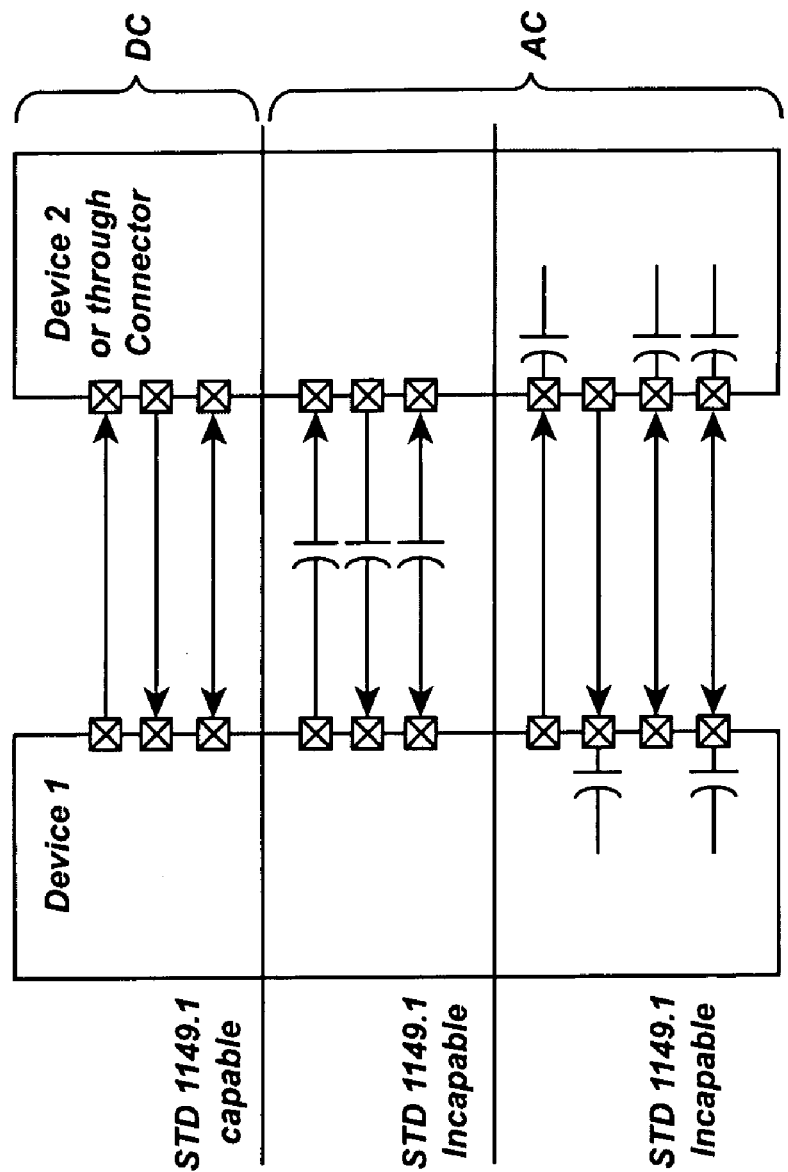
FIG. 1 is a block diagram of ten possible combinations of DC and AC coupled interconnections between two devices.

Various exemplary embodiments of the present invention are described herein in the context of programmable test pattern driver and capture mechanisms for boundary scan cluster or functional block testing. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to exemplary implementations of the present invention as illustrated in the accompanying drawings. The same reference indicators will be used throughout the drawings and the following detailed descriptions to refer to the same or like parts.

In the interest of clarity, not all of the routine features of the exemplary implementations described herein are shown and described. It will of course, be appreciated that in the development of any such actual implementation, numerous implementation-specific decisions must be made in order to achieve the specific goals of the developer, such as compliance with application-and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In the context of the present invention, the term "network" includes local area networks (LANs), wide area networks (WANs), the Internet, cable television systems, telephone systems, wireless telecommunications systems, fiber optic networks, ATM networks, frame relay networks, satellite communications systems, and the like. Such networks are well known in the art and consequently are not further described herein.

Included among the various testing methods of conventional 1149.1 boundary scan logic is one known as EXTEST. During the EXTEST method, a value, either logic one or logic zero, is loaded onto the latched parallel outputs of the update data registers of the BSCs of the driving IC using a PRELOAD instruction or is loaded with a ShiftDR state while the IC is in the EXTEST instruction. The value being driven is then sampled by the input BSCs of the receiving IC when the TAP controller passes through a CaptureDR state. Finally, by serially shifting out and examining the captured values, one can determine the reliability of the interconnections. This process assumes that the logic value during the time of capture is a static DC value. As noted above, this assumption only holds if the interconnections are DC coupled. As a result, the EXTEST method fails to test AC coupled interconnections.

To address the failure of conventional 1149.1 boundary scan logic in general and the EXTEST method more specifically, what is known as an AC boundary scan test design specification is being developed. In order to deal with AC coupled interconnections, it has been necessary to change the boundary scan logic and hardware. Nevertheless, every effort has been made to design the changes to be backward compatible with conventional testing. As a result, many of the details for AC test function and implementation are the same as those for conventional DC testing.

Figure 2:
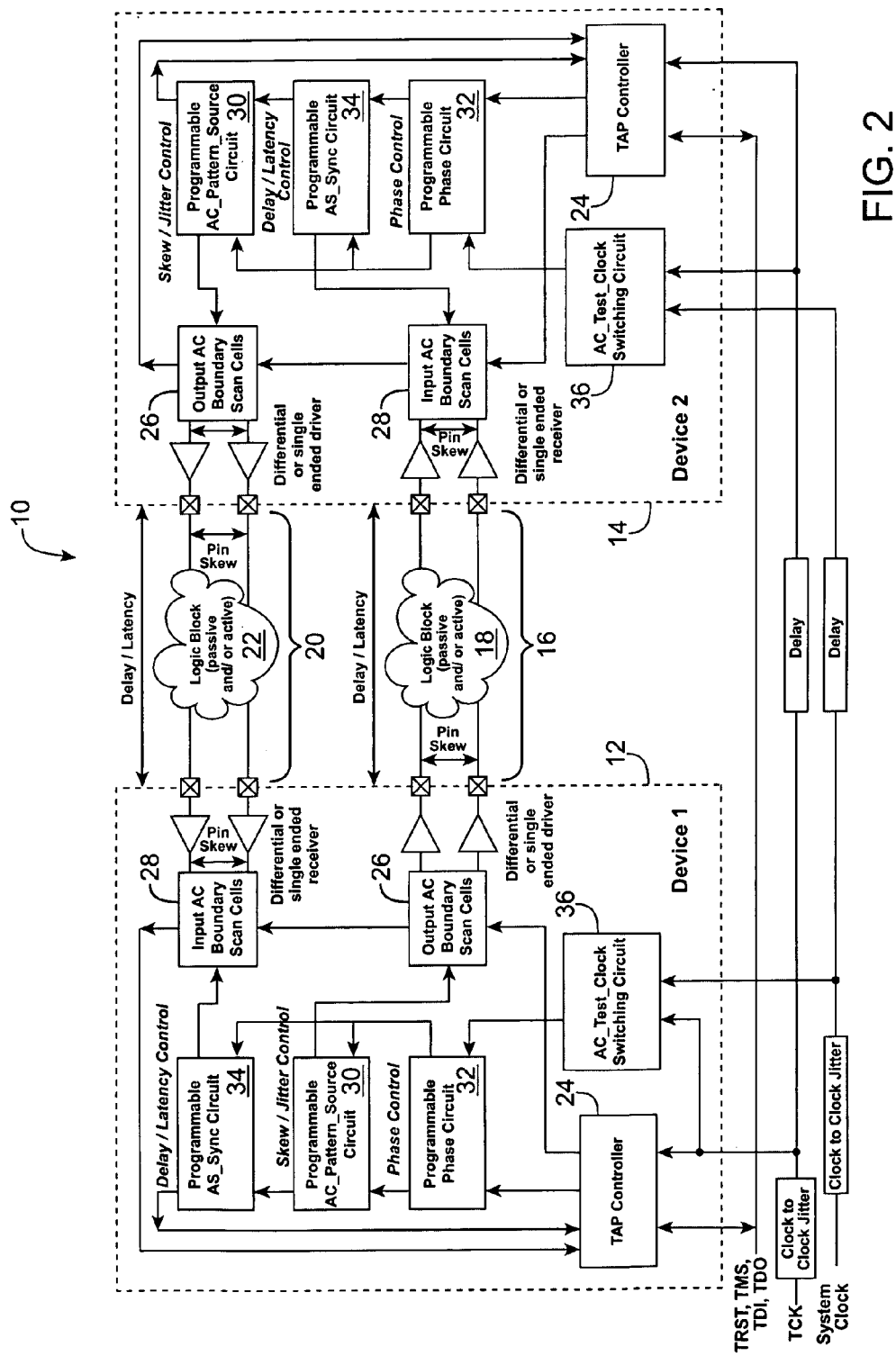
FIG. 2 is a block diagram of a boundary scan test system including two devices under test.

Turning now to FIG. 2, a block diagram of a boundary scan test system 10 including two devices under test 12 and 14 is shown. The system 10 is presented only for example purposes and may take one of may possible configurations in a practical application. The two devices 12 and 14 are connected by a first signal path 16 from the first device (Device 1) 12 to the second device (Device 2) 14. The first signal path 16 is shown to include two conductors and a logic block 18. The logic block 18 may contain any manner and number of passive and active components that may or may not effect the signals carried by the first signal path 16. The logic block 18 may even be a conventional DC coupled signal path. More than two conductors might be included in the first signal path 16 and may include a single-ended or differential signal path. The two devices 12 and 14 are also connected by a second signal path 20 from the second device 14 to the first device 12. The second signal path 20 contains a logic block 22 and the second signal path 20 is similar to the first signal path 16 except for the direction of travel. Other connections to or between the two devices 12 and 14 may also exist, however most of them have been deleted in the interest of clarity. Further, many of the elements internal to each of the two devices 12 and 14 have also been deleted in the interest of clarity. The two devices 12 and 14 are shown to include essentially the same elements, however this is not strictly required. The first device 12 includes a TAP controller 24, output AC BSCs 26, and input AC BSCs 28 as generally described above. The BSCs are shown connected in a chain with the TAP controller 24. The first device 12 further includes a programmable AC_Pattern_Source signal generator 30, a programmable phase controller 32, a programmable AC_Sync signal generator 34, and an AC_Test_Clock signal switcher 36 connected as shown. The latter four elements will be discussed in further detail below. When the first device 12 is transmitting test signals over the first signal path 16, it may be referred to as containing a test pattern driver or being a test signal transmitter. Equally, when the second device 14 is receiving test signals over the first signal path 16, it may be referred to as containing a test pattern capture mechanism or being a test signal receiver. The opposite is true when the roles are reversed and test signals are being transmitted over the second signal path 20 from the second device 14 to the first device 12.

Figure 3:
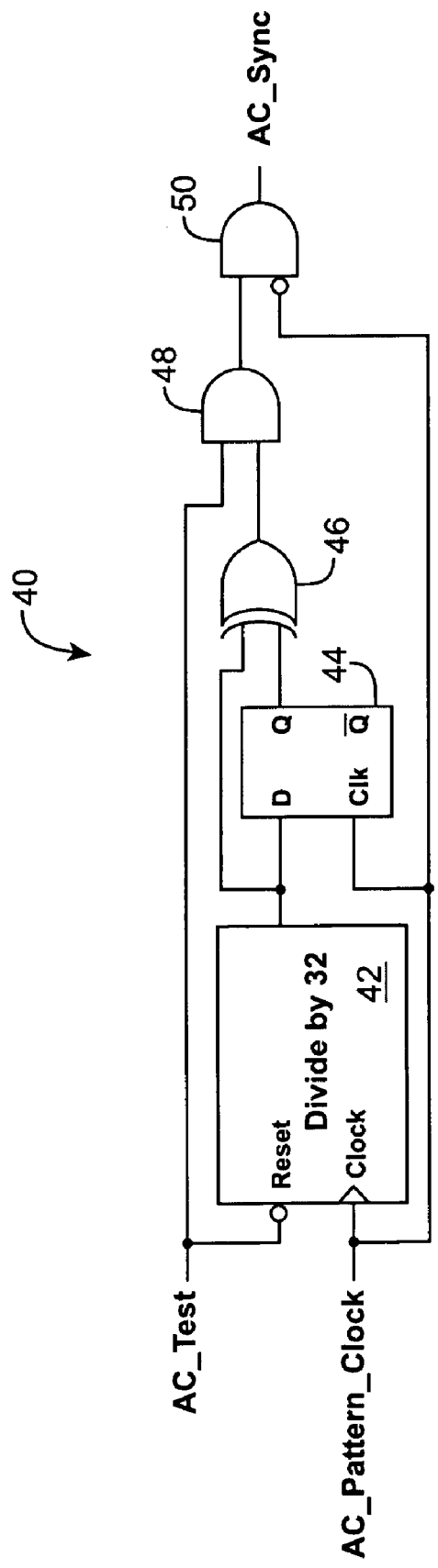
FIG. 3 is a schematic diagram of a non-programmable AC_Sync signal generator.

Turning now to FIG. 3, a schematic diagram of a non-programmable AC_Sync signal generator 40 is shown. The non-programmable generator 40 includes a divide by 32 module 42, a register 44, a XOR logic gate 46, and a pair of AND logic gates 48 and 50 connected as shown. The non-programmable generator 40 takes as input an AC_Test signal and an AC_Pattern_Clock signal and generates the AC_Sync signal. The register 44 has a data input (D), a clock input (CLK), a normal output (Q), and an inverted output (Q bar or not Q).

Figure 4:
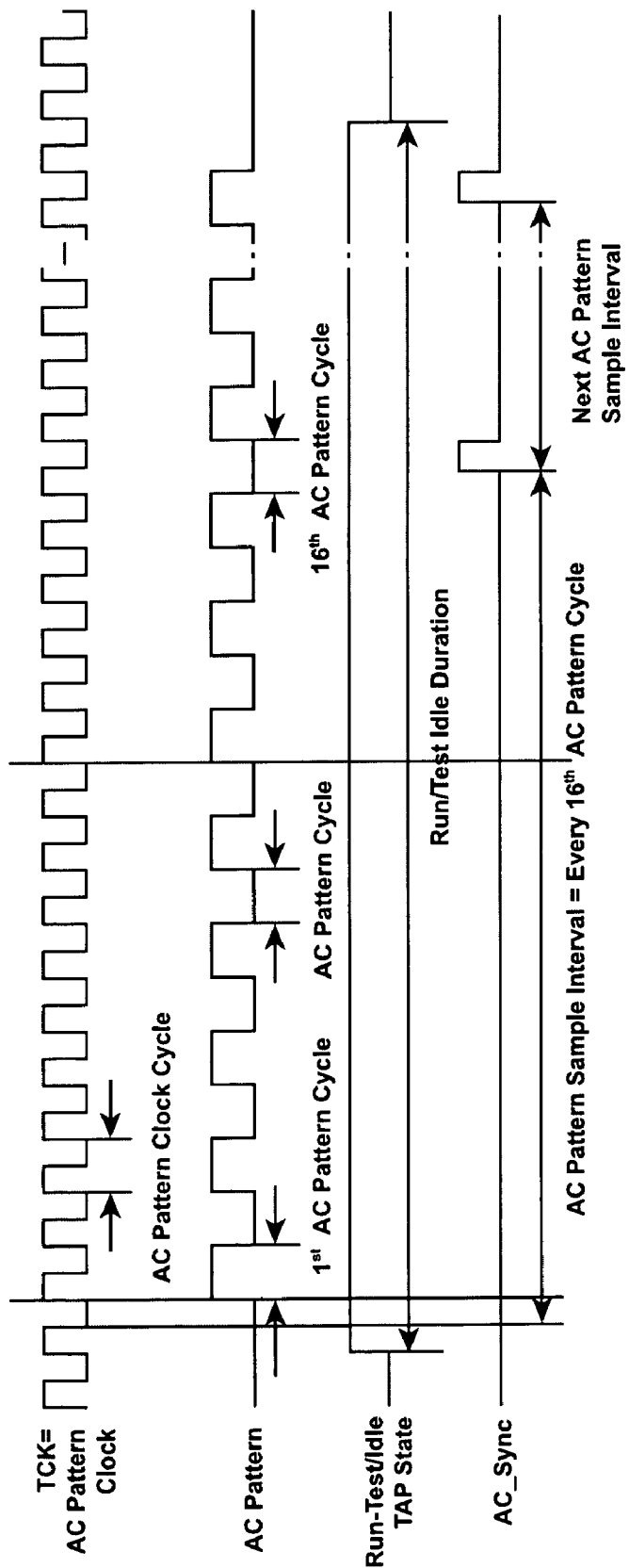
FIG. 4 is a signal timing diagram showing the default characteristics of three testing signals.

Turning now to FIG. 4, a signal timing diagram showing the default characteristics of three testing signals is shown. The signals include an AC_Pattern_Clock signal, an AC_Pattern signal, and the AC_Sync signal. The AC_Pattern_Clock signal might be the same as the TCK signal or it might be a specially generated signal. The AC_Sync signal might be generated by the non-programmable generator 40 of FIG. 3. The signals are shown relative to the state of the TAP controller when it is in the Run-Test/Idle (RTI) state for AC boundary scan testing. The diagram shows the AC pattern sample occurring at every sixteenth AC pattern clock cycle. The AC_Sync signal is used by the input BSC of the receiver to sample the incoming AC boundary scan test data at the falling edge of the AC_Pattern_Clock signal.

Figure 5:
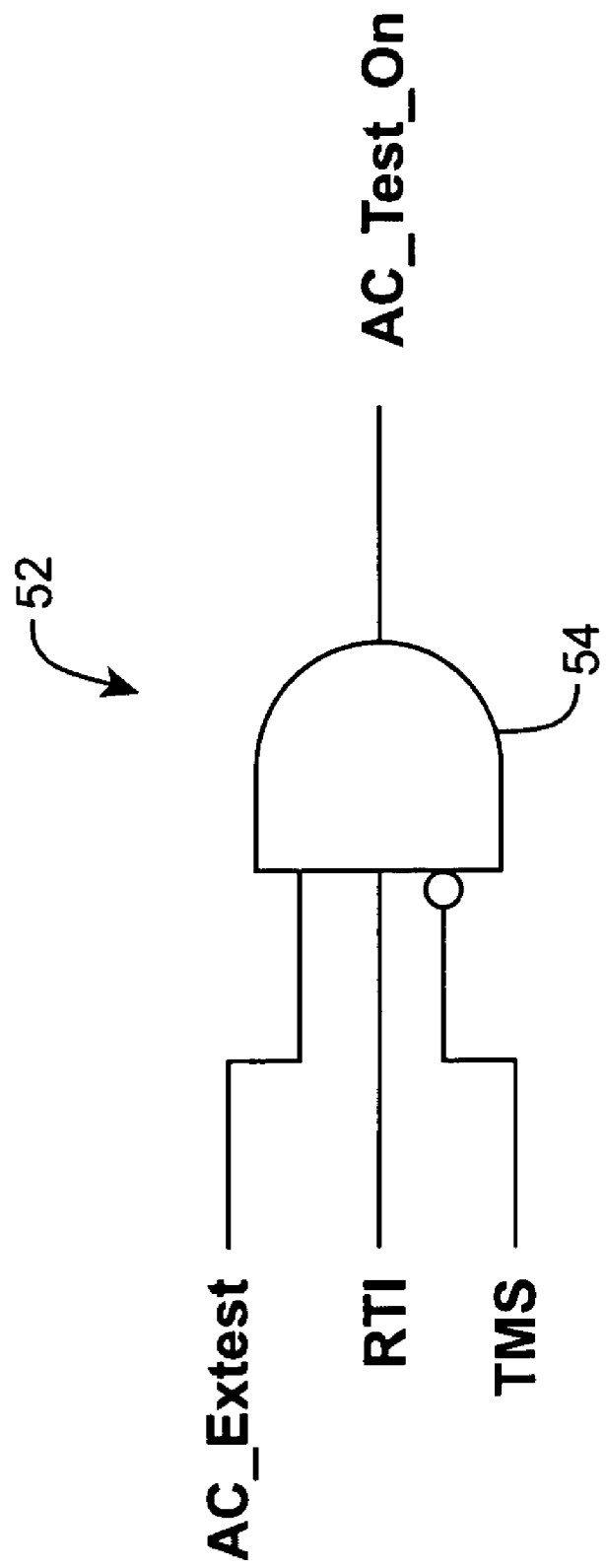
FIG. 5 is a schematic diagram of an AC_Test_On signal decoder.

In addition to the signals shown in FIG. 4, an AC_Test_On signal is also used for testing purposes. Turning now to FIG. 5, a schematic diagram of an AC_Test_On signal decoder 52 is shown. The decoder 52 includes an AND logic gate 54 and takes as input an AC_EXTEST signal, the RTI state signal, and the TMS signal and generates the AC_Test_On signal.

As noted above, in order to produce accurate results, the three difficulties of delay, skew, and jitter should be accounted for during AC coupled cluster testing and AC coupled functional block testing. A flexible approach is proposed that includes a combination of controlling the test pattern driver and the test pattern capture mechanism. Such programmable control can allow the successful testing of many components.

Figure 6:
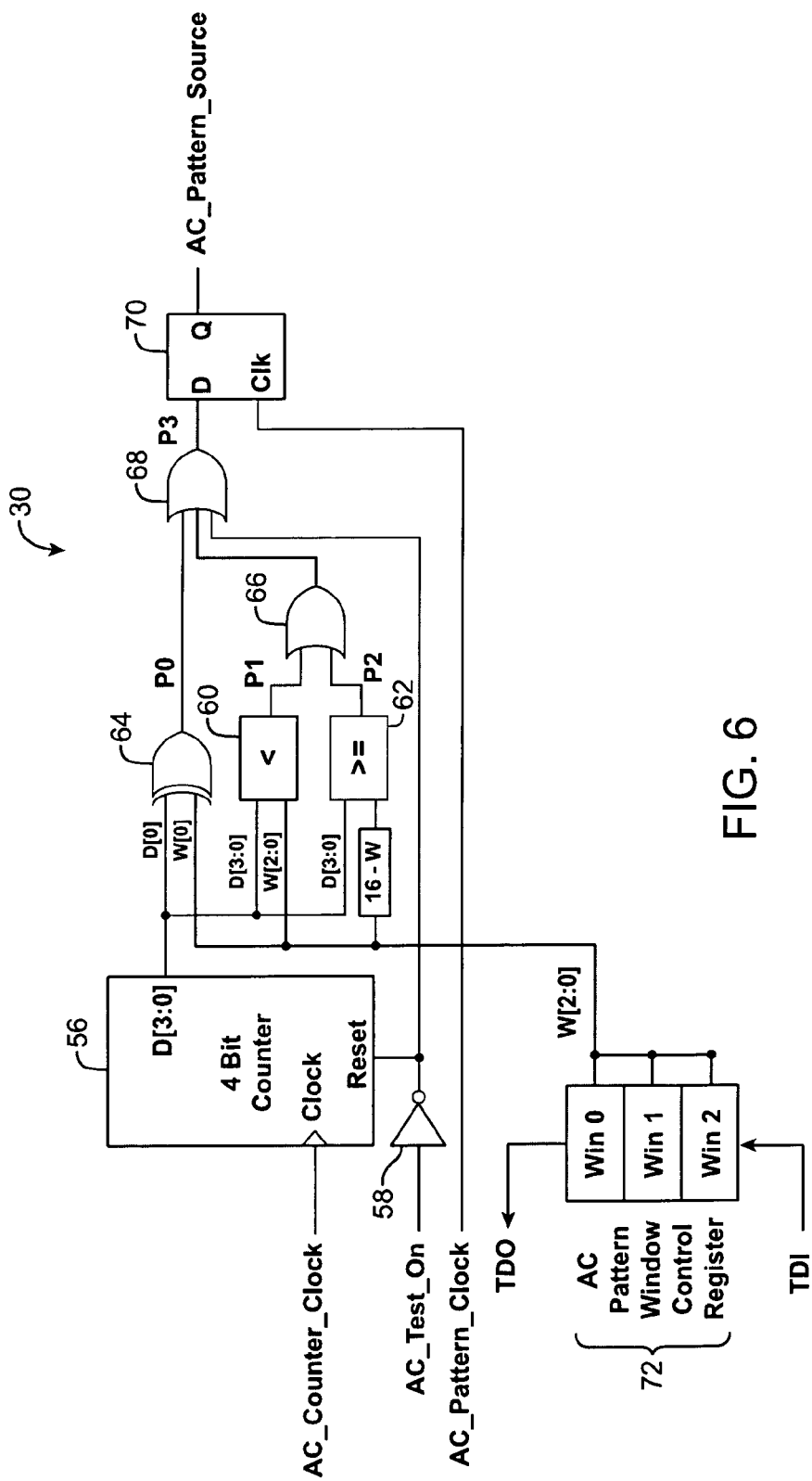
FIG. 6 is a schematic diagram of the programmable AC_Pattern_Source signal generator of FIG. 2.

Turning now to FIG. 6, a schematic diagram of the programmable AC_Pattern_Source signal generator 30 of FIG. 2 is shown. The generator 30 may be included in the test signal transmitter. The generator 30 includes a four bit counter 56, an inverter 58, two comparator blocks 60 and 62, an XOR logic gate 64, a pair of OR logic gates 66 and 68, a register 70, and an AC pattern window control register 72 connected as shown. In the present case, the window control register 72 is shown to include three bits (W [2:0]), to be part of the boundary scan test registers, and to be accessed through TDI and TDO using predefined public instructions. The window control register 72 is defined by the designer and may vary. The generator 30 can produce AC patterns that stay unchanged before and after the original capture location of the sixteenth AC pattern cycle, that is, the AC pattern remains unchanged for at least one AC pattern cycle and at most fifteen AC pattern cycles. This can provide test designers with a wider capture window for the test signal receiver to account for one or more of the testing difficulties outlined above. The cycles in which the pattern stays unchanged is determined by means of pattern masking and the masking value is programmable through the window control register 72. Based on the masking value, the generator 30 takes as input an AC_Counter_Clock signal, the AC_Test_On signal, and the AC_Pattern_Clock signal and generates the AC_Pattern_Source signal. Recall that the AC_Test_On signal is generated by the decoder 52 of FIG. 5 above.

Figure 7:
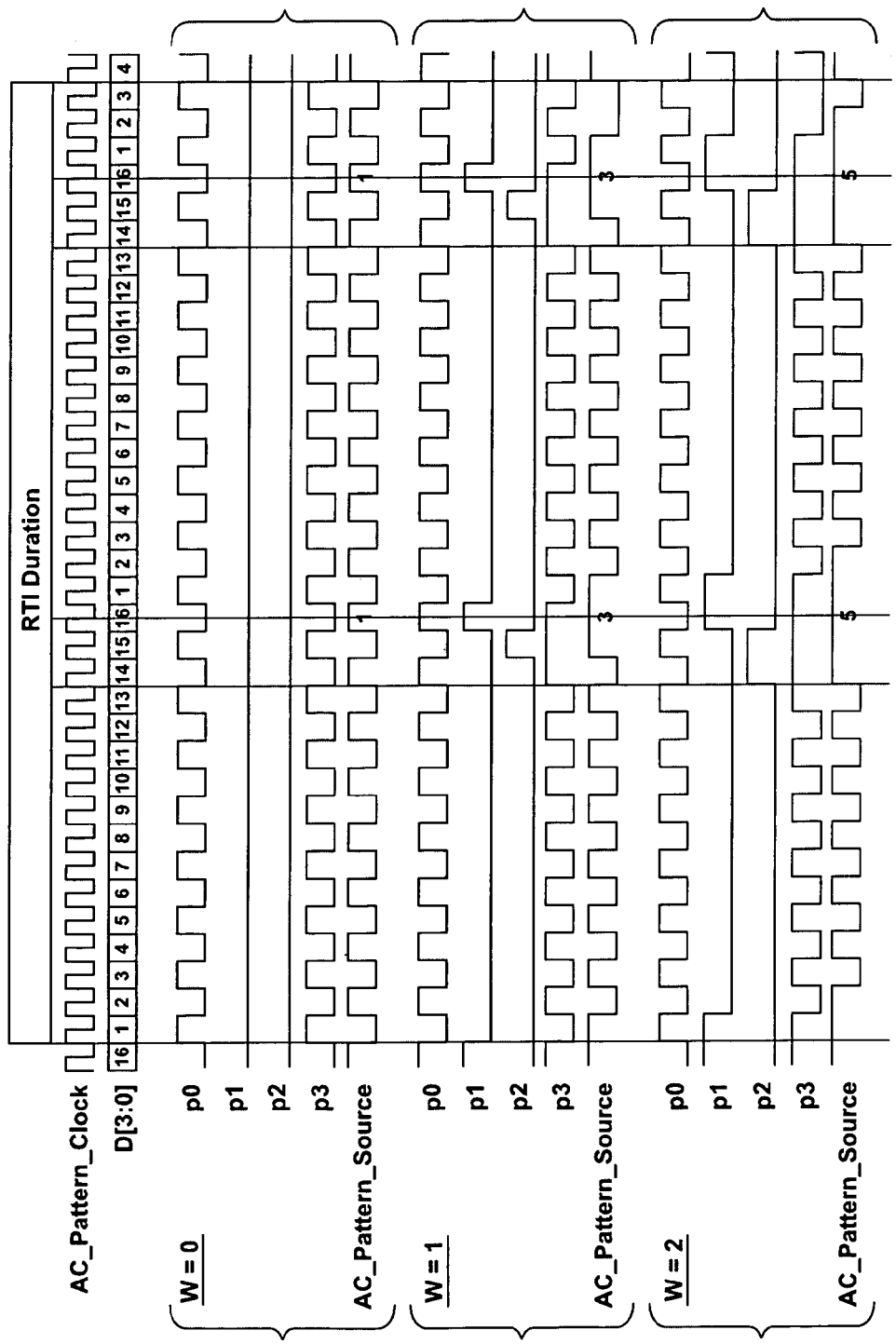
FIG. 7 is a signal timing diagram presenting the first three example AC_Pattern_Source signals.

Turning now to FIG. 7, a signal timing diagram presenting the first three example AC_Pattern_Source signals is shown. The examples include a masking value of W equal to zero (000), W equal to one (001), and W equal to two (010). The other possibilities up to W equal to seven (111) are similar. The masking value of W equal to seven may be useful during initial calibration to find the nominal delay between the transmitter and the receiver. For W equal to zero, that is, no masking, the AC_Pattern_Source signal is the same as that shown in FIG. 4 with a one cycle capture window in the sixteenth cycle. For W equal to one, the AC_Pattern_Source signal remains unchanged for three consecutive cycles rather than one, that is, the original capture window plus one additional cycle on either side of the original for a total of three cycles. The rest of the signal pattern continues to toggle as before. The result is a three cycle capture window centered around the sixteenth cycle as shown. For W equal to two, the AC_Pattern_Source signal remains unchanged for five consecutive cycles as shown. Hence the programmable masking duration is equal to the decimal masking value times two plus one ((W2)+1) and will result in an odd number of cycles.

Figure 8:
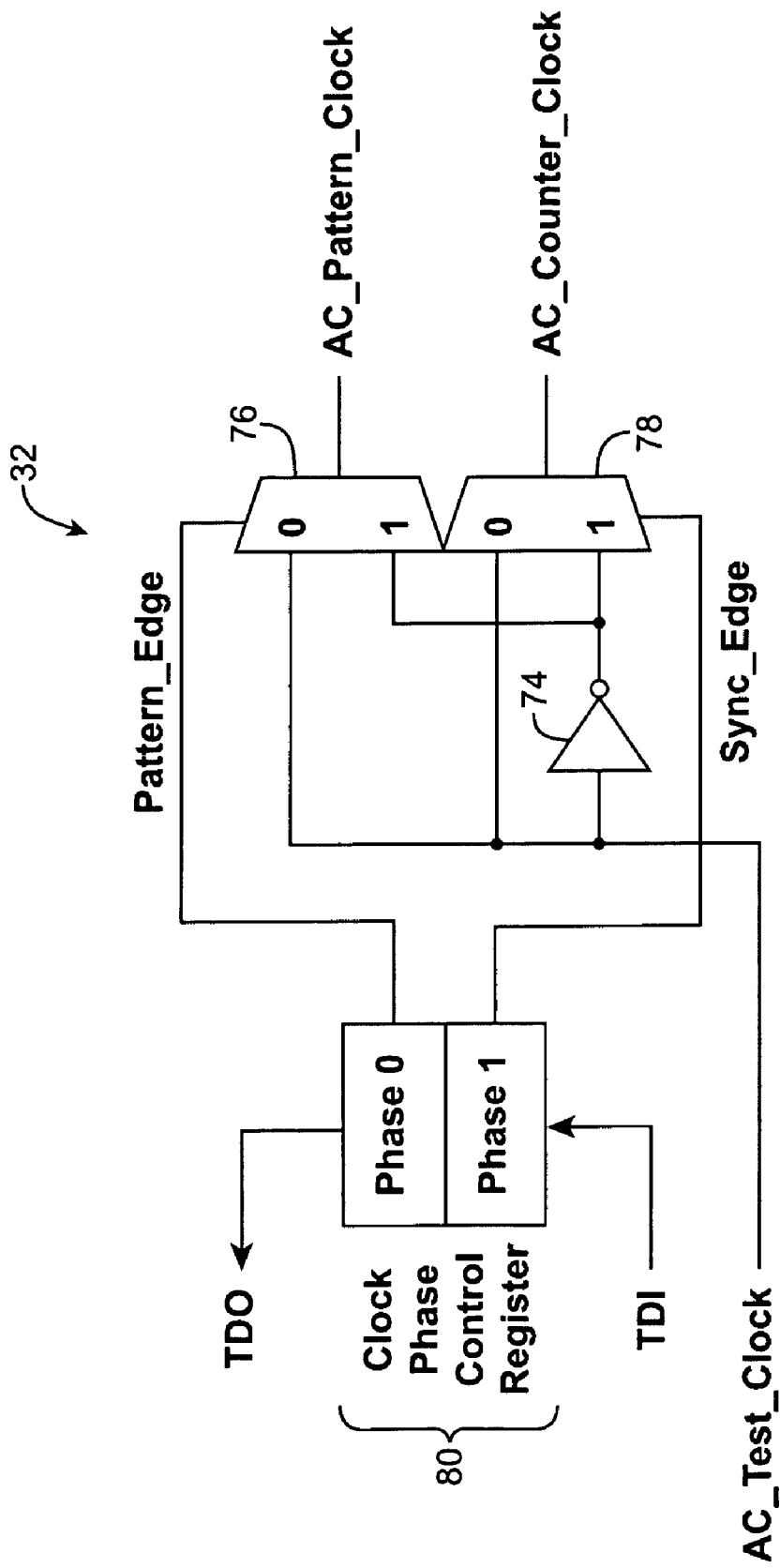
FIG. 8 is a schematic diagram of the programmable phase controller of FIG. 2.

Turning now to FIG. 8, a schematic diagram of the programmable phase controller 32 of FIG. 2 is shown. The phase controller 32 may be included in the test signal transmitter, the test signal receiver, or both. The phase controller 32 includes an inverter 74, a pair of multiplexers (MUXs) 76 and 78, and a clock phase control register 80 connected as shown. In the present case, the phase control register 80 is shown to include two bits (Phase [1:0]), to be part of the boundary scan test registers, and to be accessed through TDI and TDO using predefined public instructions. The phase control register 80 is defined by the designer and may vary. The phase controller 80 can independently control either the rising or falling edge aligned AC_Pattern_Clock signal or the AC_Counter_Clock signal. These two clock signals in turn are used to produce either the rising or falling edge aligned AC_Sync signal or the AC_Pattern_Source signal. As a result, the phase controller 32 enables the AC_Pattern_Source signal to be adjusted by a half cycle relative to the AC_Sync signal or the AC_Sync signal to be adjusted by a half cycle relative to the AC_Pattern_Source signal. This allows the test designer to control more precisely the AC boundary scan pattern application timing and the AC pattern sample timing. Based on the phase values, the phase controller 32 takes as input an AC_Test_Clock signal and produces the AC_Pattern_Clock signal and the AC_Counter_Clock signal.

Figure 9:
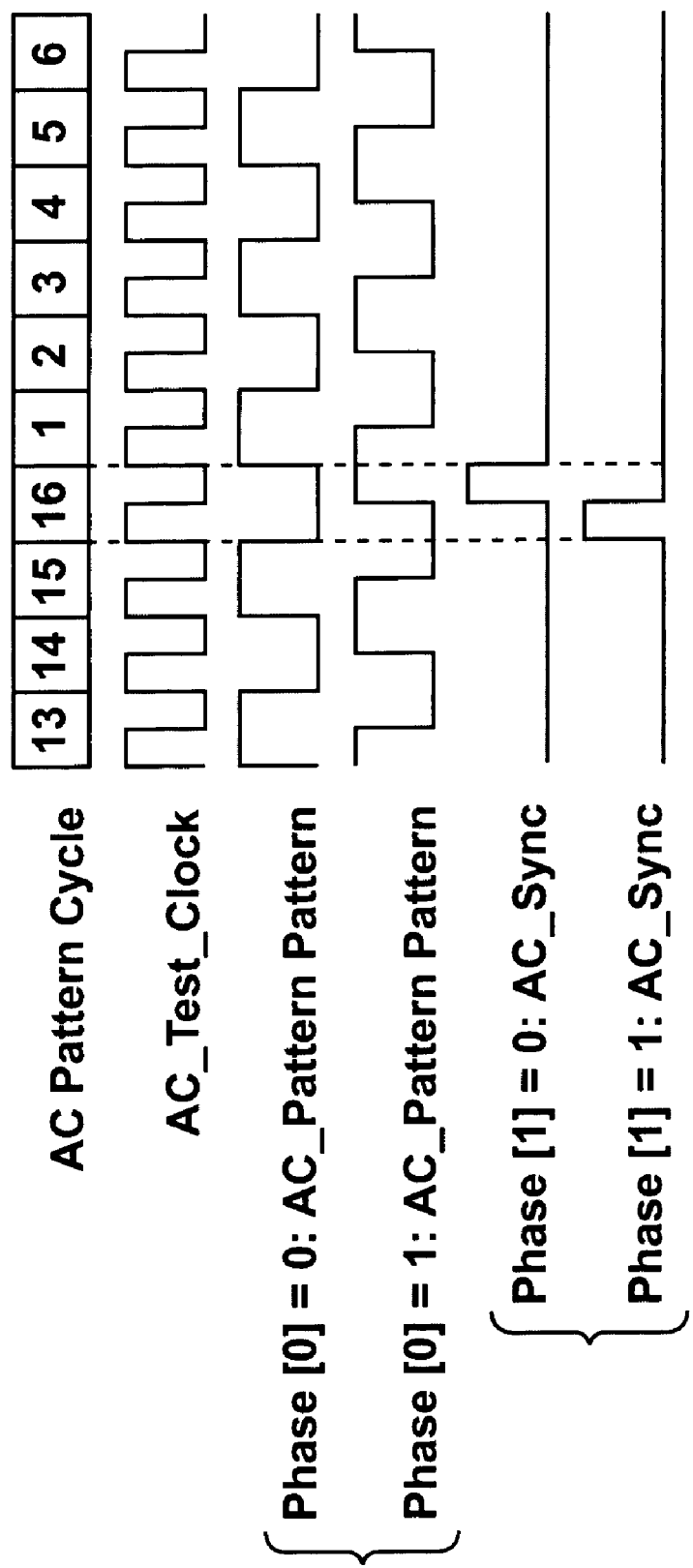
FIG. 9 is a signal timing diagram of example alternate phases of the AC_Pattern_Source signal and the AC_Sync signal.

Turning now to FIG. 9, a signal timing diagram of example alternate phases of the AC_Pattern_Source signal and the AC_Sync signal is shown. When the Phase [0] value is zero, then the AC_Pattern_Source signal is unchanged from that of FIG. 4. When the Phase [0] value is one, then the AC_Pattern_Source signal is adjusted by half a cycle. When the Phase [1] value is zero, then the AC_Sync signal is unchanged from that of FIG. 4. When the Phase [1] value is one, then the AC_Sync signal is adjusted by half a cycle.

Figure 10:
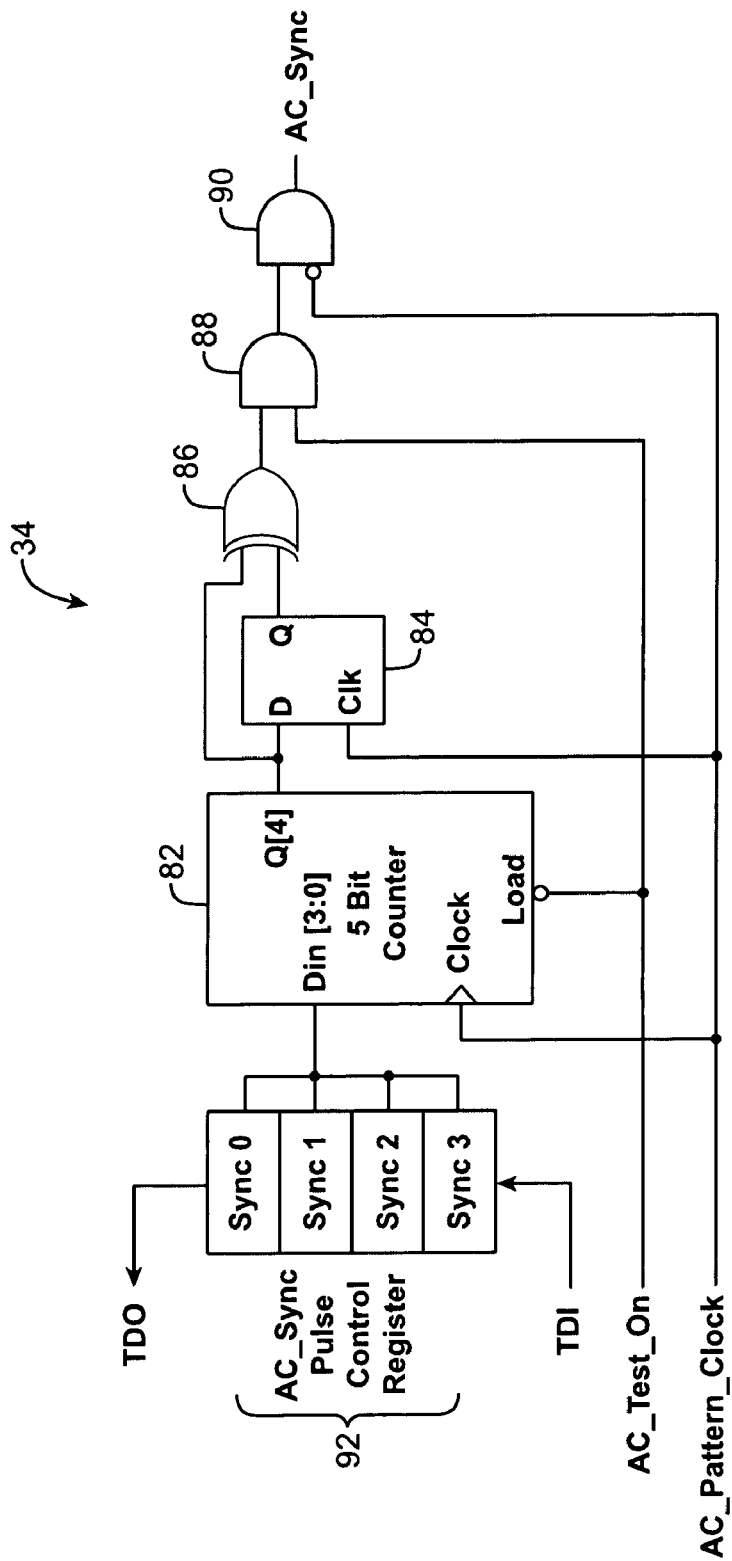
FIG. 10 is a schematic diagram of the programmable AC_Sync signal generator of FIG. 2.

Turning now to FIG. 10, a schematic diagram of the programmable AC_Sync signal generator 34 of FIG. 2 is shown. The programmable generator 34 may be included in the test signal receiver. The programmable generator 34 includes a five bit counter 82, a register 84, an XOR logic gate 86, a pair of AND logic gates 88 and 90, and an AC_Sync pulse control register 92 connected as shown. In the present case, the pulse control register 92 is shown to include four bits (Sync [3:0]), to be part of the boundary scan test registers, and to be accessed through TDI and TDO using predefined public instructions. The pulse control register 92 is defined by the designer and may vary. The programmable generator 34 can independently control the AC_Sync signal to lead or lag the original location at full cycle increments to any one of the sixteen cycles. Further, in combination with the phase controller 32 of FIG. 8, the AC_Sync signal can be controlled by half cycle increments as well. The result is thirty-two programmable choices for the sixteen cycles. This allows the test designer to move the sampling location of the incoming test data to account for one or more of the testing difficulties outlined above. Based on the sync values, the programmable generator 34 takes as input the AC_Test_On signal and the AC_Pattern_Clock signal and produces the AC_Sync signal. Recall that the AC_Test_On signal is generated by the decoder 52 of FIG. 5 and that the AC_Pattern_Clock signal is produced by the phase controller 32 of FIG. 8.

Figure 11:
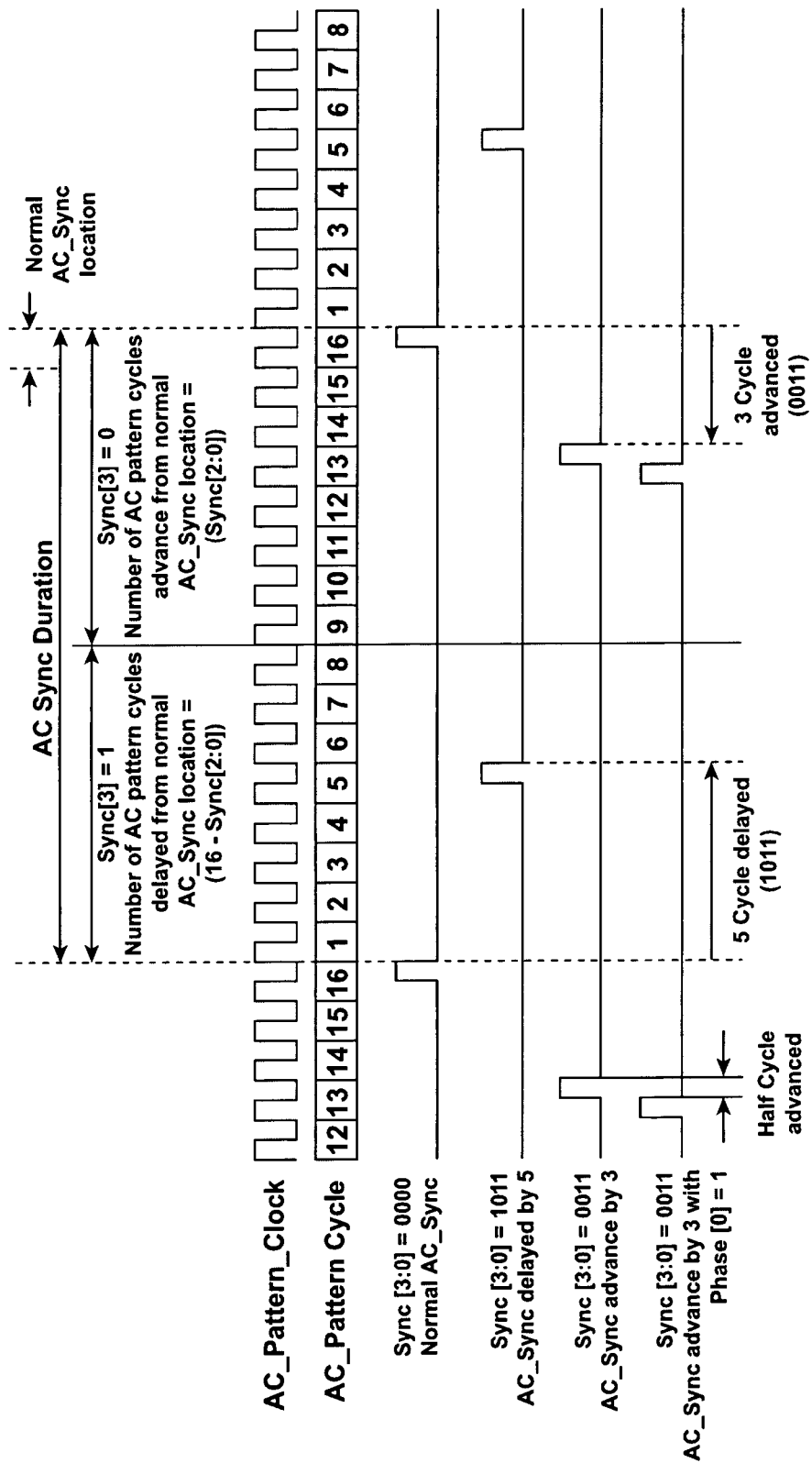
FIG. 11 is a signal timing diagram presenting four example AC_Sync signals.

Turning now to FIG. 11, a signal timing diagram presenting four example AC_Sync signals is shown. When the Sync value is equal to zero (0000), then the AC_Sync signal is normal and unchanged from that of FIG. 4. When the Sync value is equal to eleven (1011), then the AC_Sync signal is delayed by five cycles. When the Sync value is equal to three (0011), then the AC_Sync signal is advanced by three cycles. When the Sync value is equal to three (0011) and the Phase [0] value is one, then the AC_Sync signal is advanced by three and a half cycles. Recall that the phase is adjusted by the phase controller 32 of FIG. 8. The other possibilities up to Sync equal to fifteen (1111) are similar.

Figure 12:
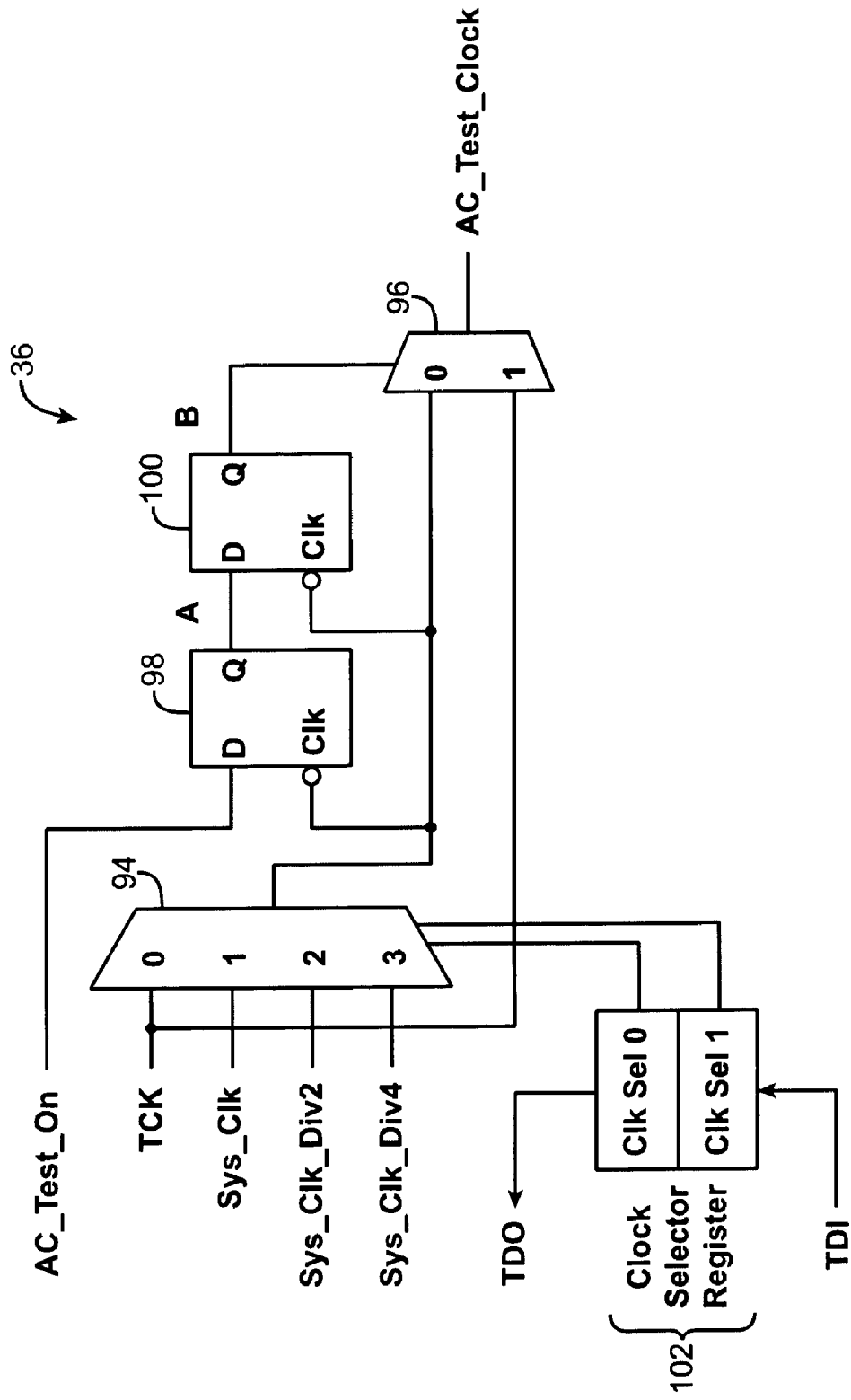
FIG. 12 is a schematic diagram of the AC_Test_Clock signal switcher of FIG. 2.

Turning now to FIG. 12, a schematic diagram of the AC_Test_Clock signal switcher 36 of FIG. 2 is shown. The signal switcher 36 may be included in the test signal transmitter, the test signal receiver, both, or externally. The signal switcher 36 is optional and, if provided, enables the test designer to utilize clock signals other than the standard TCK signal. The signal switcher 36 includes a pair of MUXs 94 and 96, a pair of registers 98 and 100, and a clock selector register 102 connected as shown. In the present case, the clock selector register 102 is shown to include two bits (Clk Sel [1:0]), to be part of the boundary scan test registers, and to be accessed through TDI and TDO using predefined public instructions. The clock selector register 102 is defined by the designer and may vary. The signal switcher 36 can be used by the test designer to select one of four clock signals depending on the circumstances. For example, the faster Sys_Clk signal might be chosen over the TCK signal for at-speed testing purposes. In the case shown, there are four example clock signals, however the number might be higher or lower and those clock signals that are offered for selection might be different from those shown. Based on the clock selector value, the signal switcher 36 takes as input the AC_Test_On signal, the TCK signal, a Sys_Clk signal, a Sys_Clk Div2 signal, and a Sys_Clk_Div4 signal and produces the AC_Test_Clock signal. Recall that the AC_Test_On signal is generated by the decoder 52 of FIG. 5 and that the AC_Test_Clock signal is utilized by the phase controller 32 of FIG. 8.

Figure 13:
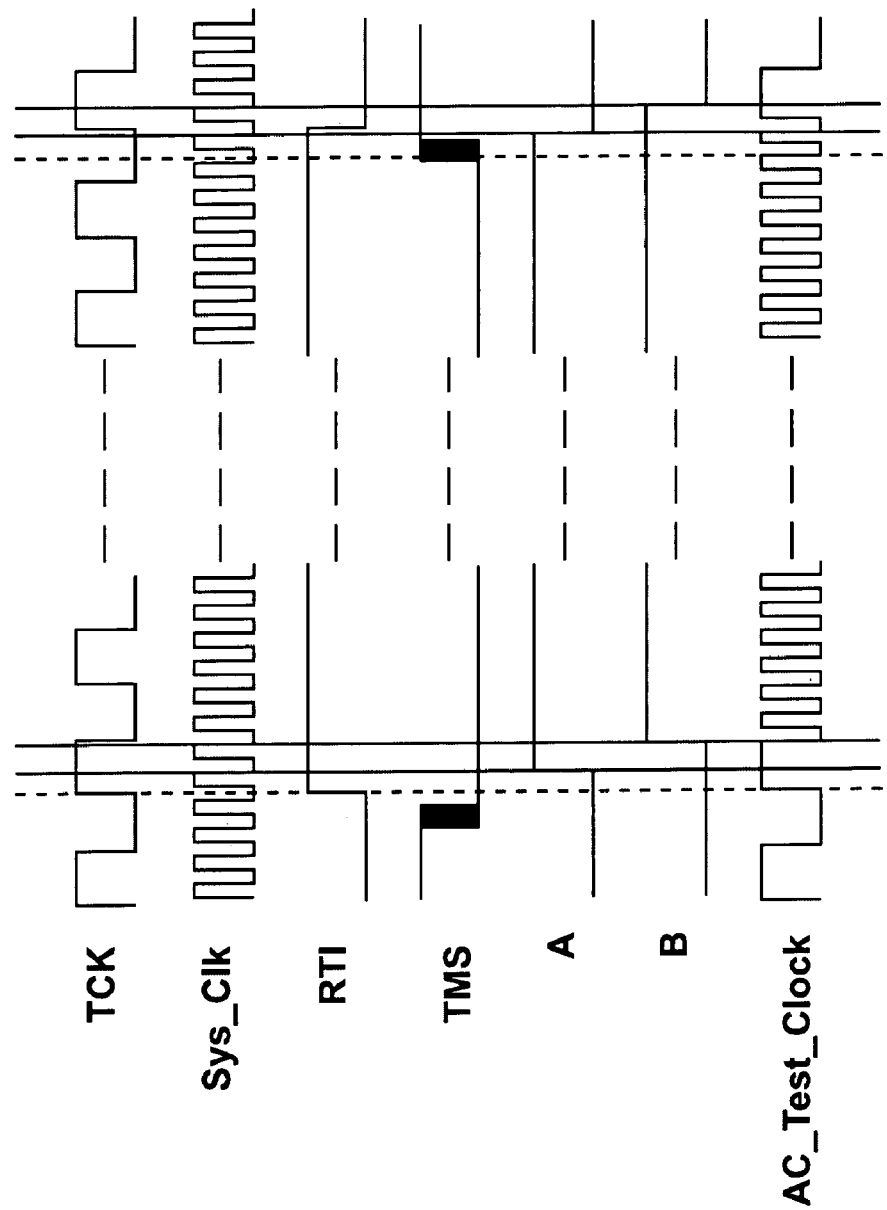
FIG. 13 is a signal timing diagram presenting selection of the AC_Test_Clock signal.

Turning now to FIG. 13, a signal timing diagram presenting selection of the AC_Test_Clock signal is shown. A review of the diagram will show that the signal switcher 36 of FIG. 12 allows the AC_Test_Clock signal to be switched during AC boundary scan testing. In the example shown, the signal switcher 36 provides AC_Test_Clock signal selection from the TCK signal to the Sys_Clk signal when the TAP controller enters the RTI state. The AC_Test_Clock signal then switches back to the TCK signal when the TAP controller exits the RTI state.

Taken together, the various elements of the boundary scan test system 10 of FIG. 2 and careful test planning should reduce or eliminate the three difficulties of delay, skew, and jitter during AC coupled cluster testing and AC coupled functional block testing. The same test methodology may be employed to test non-AC coupled nets in order to determine a relative delay measurement in the presence of one or more of skew, jitter, and delay between the two test nodes. However, accuracy of the measured delay is a function of the AC_Test_Clock signal. The test requires careful calibration of the path with the available programmable values in order to be effective.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A programmable boundary scan test transmitter, comprising:
   a Test Access Port (TAP) controller having a test data out output and a test data in input;
   a plurality of output AC boundary scan cells (BSCs), each output AC BSC having an input, a test data in input, and a test data out output;
   a programmable AC_Pattern_Source signal generator configured to produce AC signal patterns that selectively remain unchanged for at least one cycle before and after an original capture cycle location, the programmable AC_Pattern_Source signal generator having an input, a test data in input, a test data out output, and an AC_Pattern_Source signal output, the AC_Pattern_Source signal output coupled to the input of at least one of the plurality of output AC BSCs; and
   wherein the test data in inputs and test data out outputs, of the TAP controller and the output AC BSCs, respectively, are coupled into a chain from input to output.

2. The programmable transmitter as defined in claim 1, further comprising:
   a programmable phase controller configured to independently control either the rising or falling edge aligned AC_Pattern_Clock signal or AC_Counter_Clock signal, the controller having an output AC_Pattern_Clock signal coupled to the input of the programmable AC_Pattern_Source signal generator and an output AC_Counter_Clock signal coupled to the input of a programmable AC_Sync signal generator.

3. A programmable boundary scan test transmitter, comprising:
   a Test Access Port (TAP) controller having a test data out output and a test data in input;
   a plurality of output AC boundary scan cells (BSCs), each output AC BSC having an input, a test data in input, and a test data out output;
   means for producing AC signal patterns that selectively remain unchanged for at least one cycle before and after an original capture cycle location, the means for producing the AC signal patterns having an input, a test data in input, a test data out output, and a signal output, the means for producing the AC signal patterns coupled to the input of at least one of the plurality of output AC BSCs; and
   wherein the test data in inputs and test data out outputs of the TAP controller and the output AC BSCs, respectively, are coupled into a chain from input to output.

4. The programmable transmitter as defined in claim 3, further comprising:
   means for independently controlling either the rising or falling edge aligned AC_Pattern_Clock signal or AC_Counter_Clock signal having an AC_Pattern_Clock signal output coupled to the input of the means for producing AC signal patterns and an AC_Counter_Clock signal output coupled to the input of a means for producing AC_Counter_Clock signals.

5. A programmable boundary scan test receiver, comprising:
   a Test Access Port (TAP) controller having a test data out output and a test data in input;
   a plurality of input AC boundary scan cells (BSCs), each input AC BSC having an input, a test data in input, and a test data out output;
   a programmable AC_Sync signal generator coupled to means for independently controlling the AC_Sync signal to lead or lag an original cycle location at full cycle increments, the means for independently controlling the AC_Sync signal having an input, a test data in input, a test data out output, and an AC_Sync signal output, the AC_Sync signal output coupled to the input of at least one of the plurality of input AC BSCs; and
   wherein the test data in inputs and test data out outputs of the TAP controller and the input AC BSCs, respectively, are coupled into a chain from input to output.

6. The programmable receiver as defined in claim 5, further comprising:
   means for independently controlling either the rising or falling edge aligned AC_Pattern_Clock signal or AC_Counter_Clock signal having an AC_Sync signal output coupled to the input of the programmable AC_Sync signal generator and an AC_Pattern_Clock signal output coupled to the input of a programmable AC_Pattern_Source signal generator.

7. A boundary scan test system, comprising:
   a first device under test having a transmitter output and a receiver input; and
   a second device under test having a receiver input and a transmitter output, wherein the transmitter output of the first device is in communication with the receiver input of the second device and the transmitter output of the second device is in communication with the receiver input of the first device and wherein the first device comprises:

a Test Access Port (TAP) controller having a test data out output and a test data in input;

a plurality of output AC boundary scan cells (BSCs), each output AC BSC having an input, a test data in input, and a test data out output, and an output, wherein the output is in communication with the transmitter output of the first device;

a plurality of input AC BSCs, each input AC BSC having a first input, a second input, a test data in input, and a test data out output, wherein the second input is in communication with the receiver input of the first device;

a programmable AC_Pattern_Source signal generator configured to produce AC signal patterns that selectively remain unchanged for at least one cycle before and after an original capture cycle location, the programmable AC_Pattern_Source signal generator having an input, a test data in input, a test data out output, and an AC_Pattern_Source signal output, the AC_Pattern_Source signal output coupled to the input of at least one of the plurality of output AC BSCs; and a programmable AC_Sync signal generator configured to independently control the AC_Sync signal to lead or lag an original cycle location at full cycle increments, the programmable AC_Sync signal generator having an input, a test data in input, a test data out output, and an AC_Sync signal output, the AC_Sync signal output coupled to the input of at least one of the plurality of output AC BSCs, wherein the test data in inputs and test data out outputs, of the TAP controller and the output AC BSCs, respectively, are coupled into a chain from input to output.

8. The system as defined in claim 7, wherein the first device further comprises:

a programmable phase controller configured to independently control either the rising or falling edge aligned AC_Pattern_Clock signal or AC_Counter_Clock signal, the controller having an input and an output AC_Pattern_Clock signal coupled to the input of the programmable AC_Pattern_Source signal generator.

9. The system as defined in claim 8, wherein the first device further comprises:

an AC_Test_Clock signal switcher configured to selectively utilize one of a plurality of clock signals including a TCK signal, the switcher having an output coupled to the input of the TAP controller.

10. The system as defined in claim 7, wherein the first device further comprises:

a programmable phase controller configured to independently control either the rising or falling edge aligned AC_Pattern_Clock signal or AC_Counter_Clock signal, the controller having an input and an output AC_Counter_Clock signal coupled to the input of the programmable AC_Sync signal generator.

11. The system as defined in claim 10, wherein the first device further comprises:

an AC_Test_Clock signal switcher configured to selectively utilize one of a plurality of clock signals including a TCK signal, the switcher having an output coupled to the input of the TAP controller.

* * * * *